(12) United States Patent
Aoyama

(10) Patent No.: US 8,781,054 B2
(45) Date of Patent: Jul. 15, 2014

(54) SEMICONDUCTOR DEVICE

(75) Inventor: Morishige Aoyama, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 304 days.

(21) Appl. No.: 13/137,144

(22) Filed: Jul. 22, 2011

(65) Prior Publication Data

US 2012/0049910 A1 Mar. 1, 2012

(30) Foreign Application Priority Data

Aug. 27, 2010 (JP) ................................. 2010-190686

(51) Int. Cl.
*H03D 3/24* (2006.01)
(52) U.S. Cl.
USPC .......... 375/376; 375/347; 375/232; 375/267; 375/350
(58) Field of Classification Search
USPC ...................................................... 375/376
See application file for complete search history.

(56) References Cited

U.S. PATENT DOCUMENTS

| 4,829,544 | A | * | 5/1989 | Oyagi et al. | ................. | 375/373 |
| 6,335,949 | B1 | * | 1/2002 | Kim | ................ | 375/232 |
| 8,111,800 | B2 | * | 2/2012 | Clovis | .......................... | 375/376 |
| 2001/0048299 | A1 | * | 12/2001 | Farjad-Rad | ................ | 324/76.52 |
| 2006/0056564 | A1 | * | 3/2006 | Takeuchi | ....................... | 375/376 |
| 2006/0222134 | A1 | | 10/2006 | Eldredge et al. | | |
| 2007/0153129 | A1 | | 7/2007 | Kawamoto et al. | | |
| 2008/0253493 | A1 | * | 10/2008 | Aoyama | ....................... | 375/376 |

FOREIGN PATENT DOCUMENTS

| JP | 2007-135189 | 5/2007 |
| JP | 2008-535387 | 8/2008 |

* cited by examiner

*Primary Examiner* — Lihong Yu
(74) *Attorney, Agent, or Firm* — McGinn IP Law Group, PLLC

(57) ABSTRACT

A semiconductor device includes a clock-and-data recovery circuit including a phase tracking loop that generates a phase difference signal indicating a phase difference between a reception clock generated from a transmission clock and an input signal and makes the reception clock track the input signal, a frequency tracking loop that performs control to make a frequency of the reception clock track a frequency of the input signal, the clock-and-data recovery circuit being configured to extract a data signal and a synchronization clock from the input signal and to control a phase and a frequency of the reception clock, a frequency error adjuster that increases or decreases a value indicated by a frequency adjustment signal according to a frequency difference signal generated based on the phase difference signal, and an oscillator that increases or decreases a frequency of the transmission clock based on the frequency adjustment signal.

14 Claims, 7 Drawing Sheets

SEMICONDUCTOR DEVICE

CROSS-REFERENCE TO RELATED APPLICATIONS

This application is based upon and claims the benefit of priority from Japanese patent application No. 2010-190686, filed on Aug. 27, 2010, the disclosure of which is incorporated herein in its entirety by reference.

BACKGROUND

The present invention relates to a semiconductor device, in particular a semiconductor device including a clock-and-data recovery circuit that extracts data from an externally-supplied input signal and an oscillator circuit that generates a clock signal to be supplied to the clock-and-data recovery circuit.

In recent years, the communication speed between semiconductor devices has been improving. As for the communication method, a parallel data transfer method and a serial data transfer method have been used. However, in recent years, it is believed that the serial data transfer method is superior to the parallel data transfer method in terms of its ability to increase the data transfer rate. Therefore, the serial data transfer method has been used more widely.

In the serial data transfer method, data signals are modulated by using a transmission clock and transferred as serial data. Then, a receiver circuit extracts the sampling clock and the data signals from the serial data. A clock-and-data recovery circuit is used for the extraction of the sampling clock and the data signals.

Further, it is essential to generate a highly-accurate clock as a transmission clock in the serial data transfer method. In general, this highly-accurate clock is generated by using a quartz resonator. However, quartz resonators are very expensive. Therefore, it has been one of the causes of high system costs. Accordingly, Japanese Unexamined Patent Application Publication No. 2007-135189 discloses a technique to generate a highly-accurate transmission clock by using a resonator having a lower accuracy than that of the quartz resonator. Further, Published Japanese Translation of PCT International Publication for Patent Application, No. 2008-535387 discloses a technique to control the frequency of a clock signal that is generated on the receiver side based on information obtained from a received signal, though its purpose is not to generate the transmission clock. The technique disclosed in Japanese Unexamined Patent Application Publication No. 2007-135189 is explained hereinafter.

Firstly, FIG. 7 shows a block diagram of a communication system 100 disclosed in Japanese Unexamined Patent Application Publication No. 2007-135189. As shown in FIG. 7, the communication system 100 includes a device 101 and a host 102. The device 101 and the host 102 include their respective transmitting/receiving circuits. In FIG. 7, only the transmitting/receiving circuit of the device 101 is illustrated. The device 101 receives a signal RX from the host 102. Further, the device 101 transmits a signal TX to the host 102. The host 102 generates a reference clock by using a reference signal generation source 120, which is formed from a quartz resonator or the like, and operates based on this reference clock. Meanwhile, the device 101 generates a reference clock by using a reference signal generation source 103, which is formed from a ceramic resonator, and operates based on this reference clock.

Note that the device 101 includes a synchronization establishment unit 111, a frequency error detector 112, a frequency generator 113, and a serializer 114. The synchronization establishment unit 111 receives a signal RX, which is received by the device 101, and extracts a clock and data from the signal RX. Then, the synchronization establishment unit 111 outputs the extracted clock as a reception signal RS and outputs the extracted data as a synchronization establishment signal SCS. Further, the synchronization establishment unit 111 converts the data into a parallel signal according to the clock, and outputs the parallel signal as reception data DT. The frequency error detector 112 receives the reception signal RS, the synchronization establishment signal SCS, a reference clock Fref, and a transmission signal TS. Then, the frequency error detector 112 detects a frequency difference between the reception signal RS and the transmission signal TS and thereby outputs a frequency adjustment signal FCS. The frequency generator 113 outputs the transmission signal TS whose frequency is determined based on the frequency adjustment signal FCS and the reference clock Fref. The serializer 114 receives the transmission signal TS and transmission data DR, and outputs a signal TX.

Note that the reception signal RS, which is extracted from the signal RX by the device 101, has the same frequency as that of the highly-accurate clock generated in the host 102. In the device 101, the transmission signal TS is generated based on this reception signal RS. That is, it is possible to generate a highly-accurate clock by using a resonator having a low accuracy in the device 101.

SUMMARY

The present inventor has found the following problem. In the device 101, the phase difference between the reception signal RS and the transmission signal TS is calculated by analog processing. Therefore, Japanese Unexamined Patent Application Publication No. 2007-135189 suffers from a problem that the frequency error detection of the transmission signal TS requires a long time. For example, assuming that the transmission signal TS is 1.5 GHz, it is necessary to count the reception signal RS at least 3000 times to detect an error of 333 ppm.

As described above, there is a problem in the device 101 that a highly-accurate clock signal cannot be generated. The highly-accurate clock signal is indispensable for the high-speed serial communication. Further, to increase the communication speed beyond the presently-used communication speed, it is necessary to increase the frequency of the clock signal and thus improve the accuracy thereof even further. Therefore, the above-described problem becomes more serious.

A first aspect of the present invention is a semiconductor device including: a clock-and-data recovery circuit including: a phase tracking loop that generates a phase difference signal indicating a phase-lead or a phase-delay between a synchronization clock and an input signal and makes a phase of the synchronization clock track a phase of the input signal; and a frequency tracking loop that performs control to make a frequency of the synchronization clock track a frequency of the input signal, the clock-and-data recovery circuit being configured to extract a data signal and a sampling clock corresponding to the data signal from the input signal; a frequency error adjuster that increases or decreases a value indicated by a frequency adjustment signal based on a frequency difference signal generated based on the phase difference signal in the frequency tracking loop; and an oscillator that increases or decreases a frequency of a transmission clock based on the value indicated by the frequency adjustment signal.

According to the semiconductor device in accordance with an exemplary aspect of the present invention, the phase of a synchronization clock is compared with the phase of an input signal in the clock-and-data recovery circuit, and the frequency of a transmission clock is controlled based on the phase comparison result. As a result, the semiconductor device according to an exemplary aspect of the present invention can perform a frequency correction of the transmission clock in a very short time.

According to the semiconductor device in accordance with an exemplary aspect of the present invention, it is possible to generate a highly-accurate clock signal having a high frequency from a clock signal that is generated by a resonator having a low accuracy.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
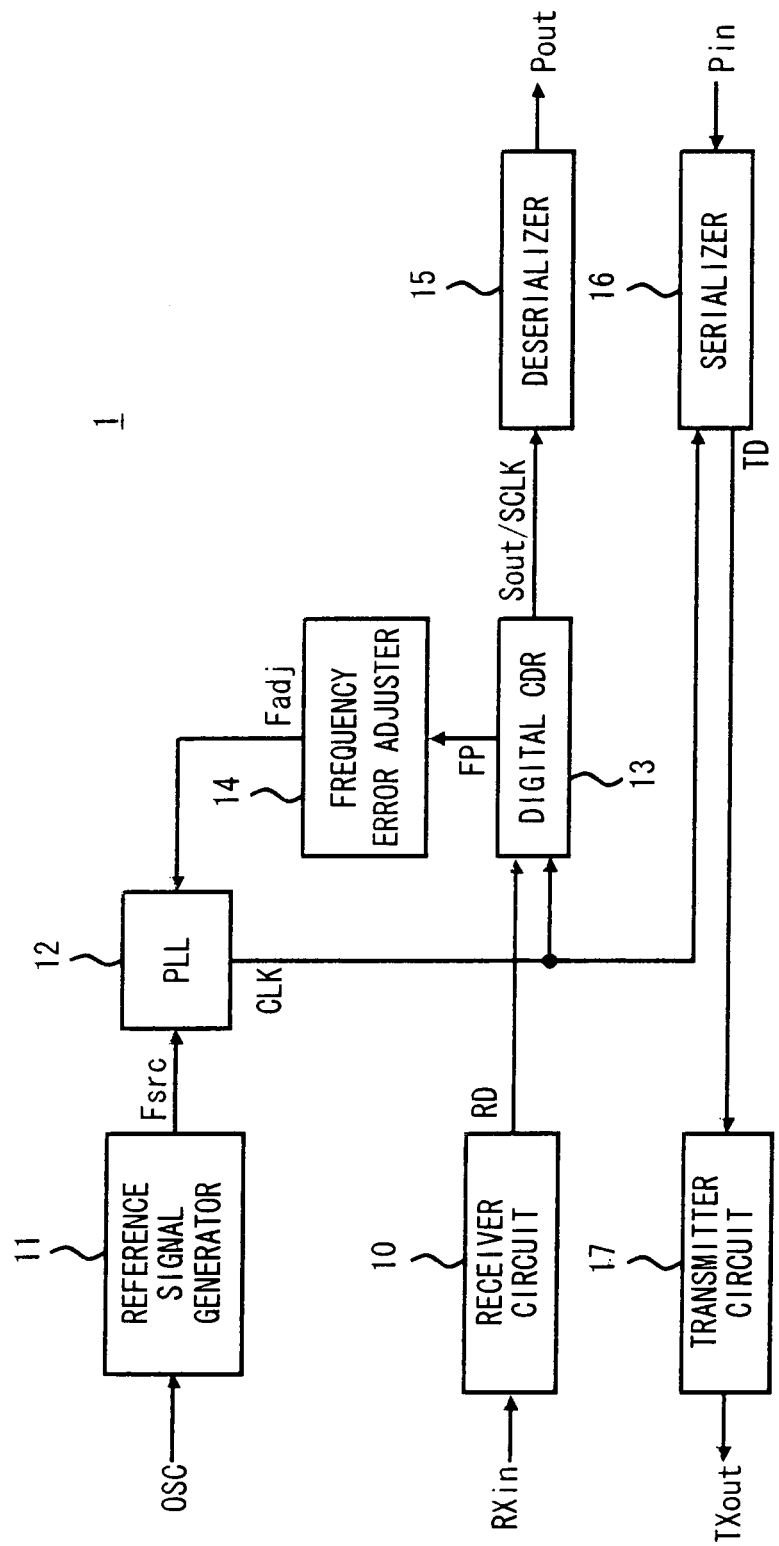
FIG. 1 is a block diagram of a semiconductor device according to an embodiment of the present invention.

Embodiments of the present invention are explained hereinafter with reference to the drawings. FIG. 1 shows a block diagram of a semiconductor device 1 according to an embodiment of the present invention. As shown in FIG. 1, the semiconductor device 1 includes a receiver circuit 10, a reference signal generator 11, a PLL (Phase Locked Loop) circuit 12, a clock-and-data recovery circuit (e.g., digital CDR) 13, a frequency error adjuster 14, a deserializer 15, a serializer 16, and a transmitter circuit 17. The semiconductor device 1 includes a transmitting/receiving circuit and other processing circuits (not shown). In the example shown in FIG. 1, the receiver circuit 10, the digital CDR 13, and the deserializer 15 form a circuit on the receiving side, while the serializer 16 and the transmitter circuit 17 form a circuit on the transmitting side.

The reference signal generator 11 forms an oscillator circuit with a ceramic resonator provided in the outside, and generates a reference clock Fsrc based on an oscillation signal OSC generated by the ceramic resonator. The ceramic resonator tends to have larger variations in comparison to quartz resonators, but is inexpensive in comparison to quartz resonators.

The PLL circuit 12 generates a transmission clock CLK based on the reference clock Fsrc. In this embodiment, the PLL circuit 12 generates the transmission clock CLK by performing a frequency multiplication of the reference clock Fsrc based on a frequency adjustment signal Fadj.

The receiver circuit 10 functions as an input buffer. That is, the receiver circuit 10 receives a reception signal RXin and sends the received signal to a subsequent circuit. The receiver circuit 10 may include an equalizer circuit that corrects the frequency characteristic of the transmission path.

In this embodiment, a digital CDR is used as the clock-and-data recovery circuit 13. The digital CDR 13 is composed of a logic circuit(s) that handles binary information, and outputs a digital signal that indicates information by using a binary value as an output signal. The digital CDR 13 generates a phase difference signal indicating a phase-lead or a phase-delay between a reception clock RCLK generated from the transmission clock CLK and an input signal RD. Further, the digital CDR 13 includes a phase tracking loop that performs control to make the phase of the reception clock RCLK track the phase of the input signal RD, and a frequency tracking loop that performs control to make the frequency of the reception clock RCLK track the frequency of the input signal RD. Further, the digital CDR 13 extracts a data signal Sout and a synchronization clock SCLK corresponding to the data signal Sout from the input signal RD, and controls the phase and frequency of the reception clock RCLK.

The frequency error adjuster 14 generates a frequency adjustment signal Fadj according to a frequency difference signal FP that is generated based on the phase difference signal in the frequency tracking loop in the digital CDR 13. Further, the frequency error adjuster 14 increases or decreases a value indicated by the frequency adjustment signal Fadj according to the frequency difference signal FP. Details of the digital CDR 13, the frequency error adjuster 14, and the PLL circuit 12 are explained later.

The deserializer 15 converts the data signal Sout, which is input in the form of serial data, into parallel data based on the synchronization clock SCLK. In FIG. 1, the converted data signal, which is output in the form of parallel data, is represented as "Pout".

The serializer 16 converts a data signal Pin, which is supplied in the form of parallel data, into serial data based on the transmission clock CLK. In FIG. 1, the serialized data signal is represented as "TD". The transmitter circuit 17 is an output buffer. The transmitter circuit 17 amplifies the data signal TD in terms of the power and outputs the amplified signal as a transmission signal TXout.

The semiconductor device 1 according to this embodiment performs communication by using data signals synchronized to the transmission clock. Note that if a single frequency is used as the transmission clock, the peak of undesired radiation becomes larger, and thereby deteriorating the EMI (Electro Magnetic Interference) characteristic. Accordingly, the semiconductor device 1 according to this embodiment is configured so as to be able to receive data signals by using a spread spectrum clock as the transmission clock. Therefore, the digital CDR 13 in the semiconductor device 1 needs to make the frequency of the synchronization clock track the frequency that is varied as a result of the spread spectrum. The digital CDR 13 includes a frequency tracking loop to perform the frequency tracking operation. Further, in the semiconductor device 1, the frequency of the transmission clock CLK is controlled by controlling the PLL circuit 12 based on a signal generated in this digital CDR 13.

Figure 2:
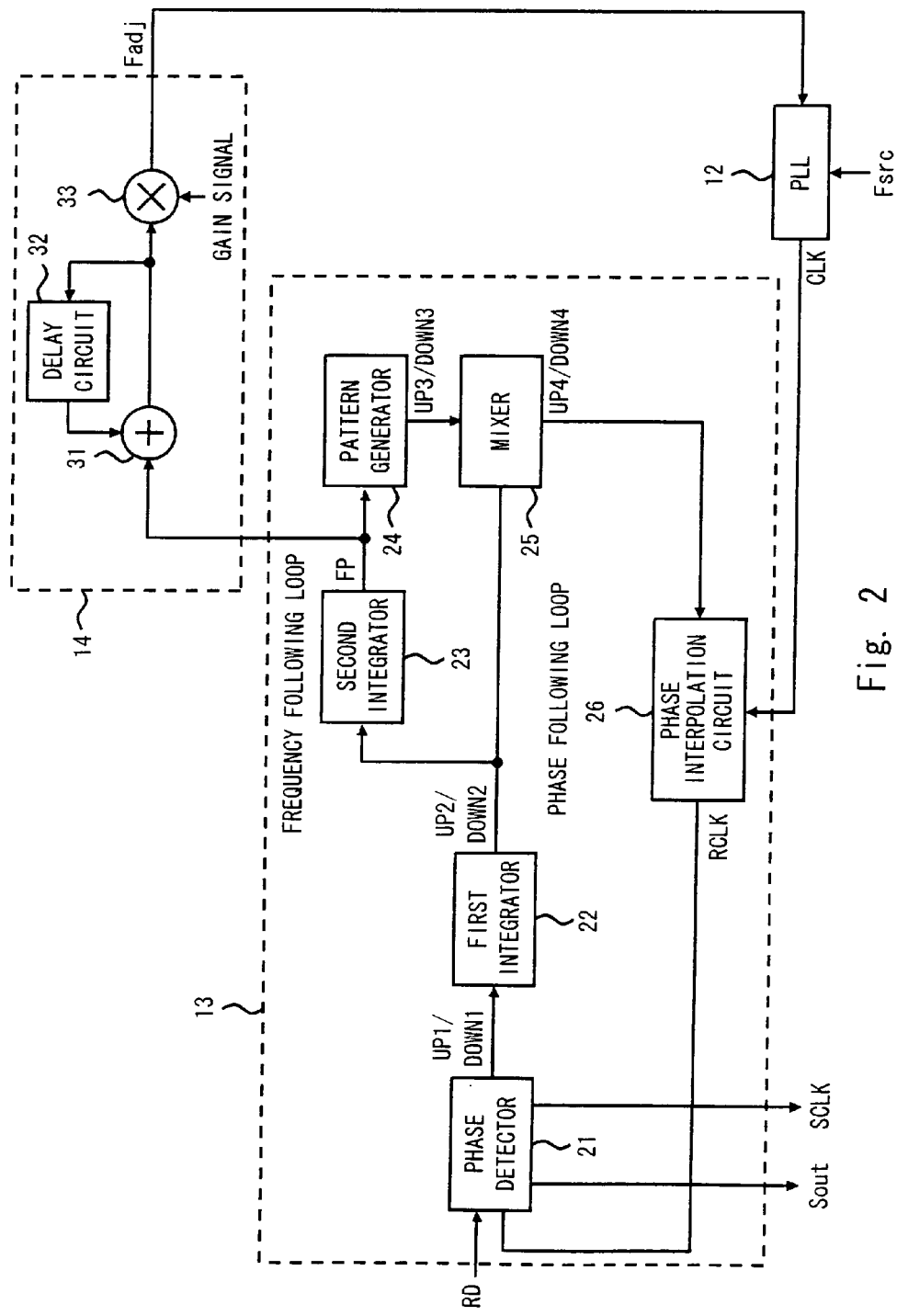
FIG. 2 is a block diagram of a digital CDR, a frequency error adjuster, and a clock generation circuit of a synchronization clock according to an embodiment.

The digital CDR 13, the frequency error adjuster 14, and the PLL circuit 12, among the components of the semiconductor device 1, are particularly explained hereinafter in a more detailed manner. FIG. 2 shows a block diagram of the digital CDR 13, the frequency error adjuster 14, and the PLL circuit 12.

The digital CDR 13 includes a phase detector 21, a first integrator 22, a second integrator 23, a pattern generator 24, a mixer 25, and a phase interpolator 26. In the digital CDR 13, the phase detector 21, the first integrator 22, the mixer 25, and the phase interpolator 26 forms a phase tracking loop. In the digital CDR 13, the phase detector 21, the first integrator 22, the second integrator 23, the pattern generator 24, the mixer 25, and the phase interpolator 26 forms a frequency tracking loop. Further, in the semiconductor device 1, the output of the second integrator 23 is used as a frequency difference signal FP.

The phase detector 21 detects a phase difference between the reception clock RCLK and the input signal RD and updates a polarity value indicated by a phase difference signal. Further, the phase detector 21 outputs the reception clock RCLK as a synchronization clock SCLK and extracts a data signal Sout from the input signal RD. More specifically, the reception clock RCLK, which is used as the synchronization clock SCLK, is input to the phase detector 21. This reception clock RCLK includes a first reception clock RCLK1 and a second reception clock RCLK3. The phase of the second reception clock RCLK3 is different from that of the first reception clock RCLK1 by 180 degrees. The phase detector 21 outputs an up-signal UP1 and a down-signal DOWN1 as phase difference signals. When the phase of the synchronization clock SCLK (e.g., first reception clock RCLK1) is delayed from the phase of the input signal RD, the phase detector 21 brings the up-signal UP1 to a first logic level (e.g., high level) and brings the down-signal DOWN1 to a second logic level (e.g., low level). On the other hands, when the phase of the synchronization clock SCLK is leading the phase of the input signal RD, the phase detector 21 brings the up-signal UP1 to a low level and brings the down-signal DOWN1 to a high level.

Figure 3:
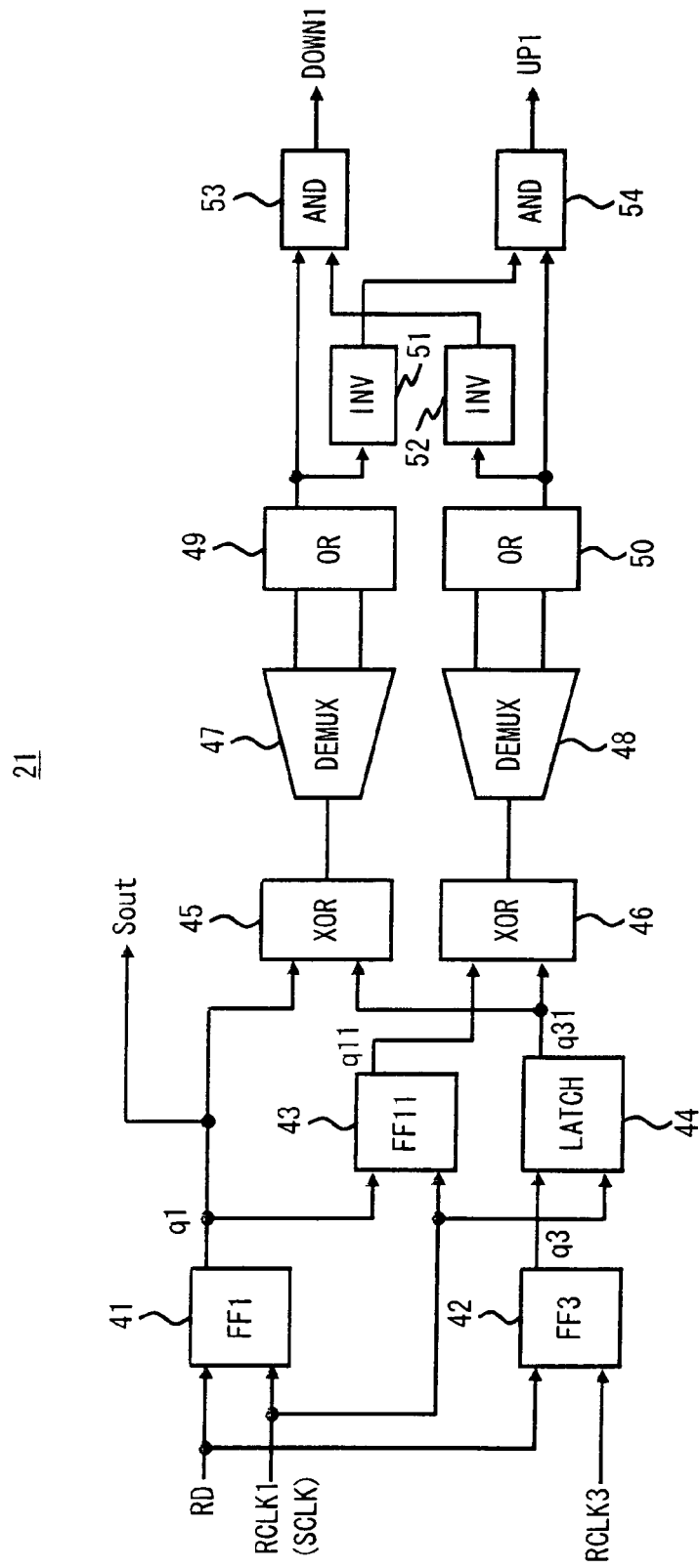
FIG. 3 is a block diagram of a phase detector of a semiconductor device according to an embodiment.

FIG. 3 shows a block diagram of the phase detector 21. As shown in FIG. 3, the phase detector 21 is composed solely of a logic circuit(s). FIG. 3 shows an example of a configuration in which 1.5 Gbps data is received by using a two-phase clock having a frequency of 1.5 GHz. The phase detector 21 includes a first flip-flop 41, a second flip-flop 42, a third flip-flop 43, a latch 44, a first exclusive-OR circuit (XOR) 45, a second exclusive-OR circuit (XOR) 46, a first demultiplexer (DEMUX circuit) 47, a second demultiplexer (DEMUX circuit) 48, a first OR circuit 49, a second OR circuit 50, a first inverter 51, a second inverter 52, a first AND circuit 53, and a second AND circuit 54.

The first flip-flop 41 receives an input signal RD and a reception clock RCLK1 at a data input terminal and a clock terminal respectively. The first flip-flop 41 is an edge-triggered flip-flop. The second flip-flop 42 receives the input signal RD and a reception clock RCLK3, whose phase is opposite to that of the reception clock RCLK1, at a data input terminal and a clock terminal respectively. The third flip-flop 43 receives the output q1 of the first flip-flop 41 and the reception clock RCLK1 at a data input terminal and a clock terminal respectively. The latch 44 receives the output q3 of the second flip-flop 42 and the reception clock RCLK1 at a data input terminal and a clock terminal respectively. The latch 44 is a through latch.

The first exclusive-OR circuit (XOR) 45 receives the output q1 of the first flip-flop 41 and the output q31 of the latch 44. The second exclusive-OR circuit (XOR) 46 receives the output q11 of the third flip-flop 43 and the output q31 of the latch 44. The first and second demultiplexers (DEMUX circuits) 47 and 48 receive the outputs of the first and second exclusive-OR circuits (XORs) 45 and 46, respectively, in a serial format and output them in a parallel format. The first OR circuit 49 obtains the logical sum of the outputs of the first demultiplexer 47. The second OR circuit 50 obtains the logical sum of the outputs of the second demultiplexer 48. The first inverter 51 outputs the inverted value of the output of the first OR circuit 49. The second inverter 52 outputs the inverted value of the output of the second OR circuit 50. The first AND circuit 53 obtains the logical product of the output of the first OR circuit 49 and the inverted value of the output of the second OR circuit 50, which is output through the inverter 52. The second AND circuit 54 obtains the logical product of the output of the second OR circuit 50 and the inverted value of the output of the first OR circuit 49. The output of the first flip-flop 41 is also output as a data signal Sout. Further, the reception clock RCLK1 is also output as a synchronization clock SCLK.

With the above-described configuration, the phase detector 21 brings the up-signal UP1 to a high level and the down-signal DOWN1 to a low level when the transition timing of the input signal RD is found between the rising edge of the reception clock RCLK1 and the rising timing of the reception clock RCLK3. On the other hand, when the transition timing of the input signal RD is found between the rising edge of the reception clock RCLK3 and the rising timing of the reception clock RCLK1, the phase detector 21 brings the up-signal UP1 to a low level and the down-signal DOWN1 to a high level. Further, when each of the demultiplexers has two-parallel outputs, the clock (not shown) that is supplied to the circuits connected in the subsequent stage of the phase detector 21 has half the frequency of the reception clock supplied to the phase detector 21.

Next, the circuits connected in the subsequent stage of the phase detector 21 are explained. The first integrator 22 increases or decreases a first count value based on the phase difference signal (e.g., up-signal UP1 and the down-signal DOWN1), and outputs an up-signal UP2 or a down-signal DOWN2 when the first count value reaches a predetermined value. That is, the first integrator 22 integrates polarity values indicated by the phase difference signal. Note that the up-signal UP2 and the down-signal DOWN2 are also referred to as "first up-signal" and "first down-signal" respectively.

Specifically, an up-down counter is used as the first integrator 22. In this first integrator 22, an upper-limit count value and a lower-limit count value are set. Further, when the up-signal UP1 is at a high level, the first integrator 22 increases the first count value according to the clock. On the other hand, when the down-signal DOWN1 is at a high level, the first integrator 22 decreases the first count value according to the clock. Then, when the first count value reaches the upper-limit count value, the first integrator 22 brings the up-signal UP2 to a high level, whereas when the first count value reaches the lower-limit count value, the first integrator 22 brings the down-signal DOWN2 to a high level.

The second integrator 23 increases or decreases a count value based on the up-signal UP2 and the down-signal DOWN2, and outputs the count value as a frequency difference signal FP. More specifically, the second integrator 23 is composed of an up-down counter. When the up-signal UP2 is at a high level, the second integrator 23 increases a second count value according to the clock. On the other hand, when the down-signal DOWN2 is at a high level, the second integrator 23 decreases the second count value according to the clock. Further, the second integrator 23 outputs the second count value as a frequency difference signal FP. Note that the second integrator 23 according to this embodiment has such a configuration that the second integrator 23 generates an intermediate frequency difference signal by integrating the up-signal UP2 and the down-signal DOWN2 and increases or decreases the second count value based on this intermediate frequency difference signal.

The pattern generator 24 generates an up-signal UP3 and a down-signal DOWN3 at predetermined intervals based on the frequency difference signal FR The up-signal UP3 and the down-signal DOWN3 are also referred to as "second up-signal" and "second down-signal" respectively.

Figure 4:
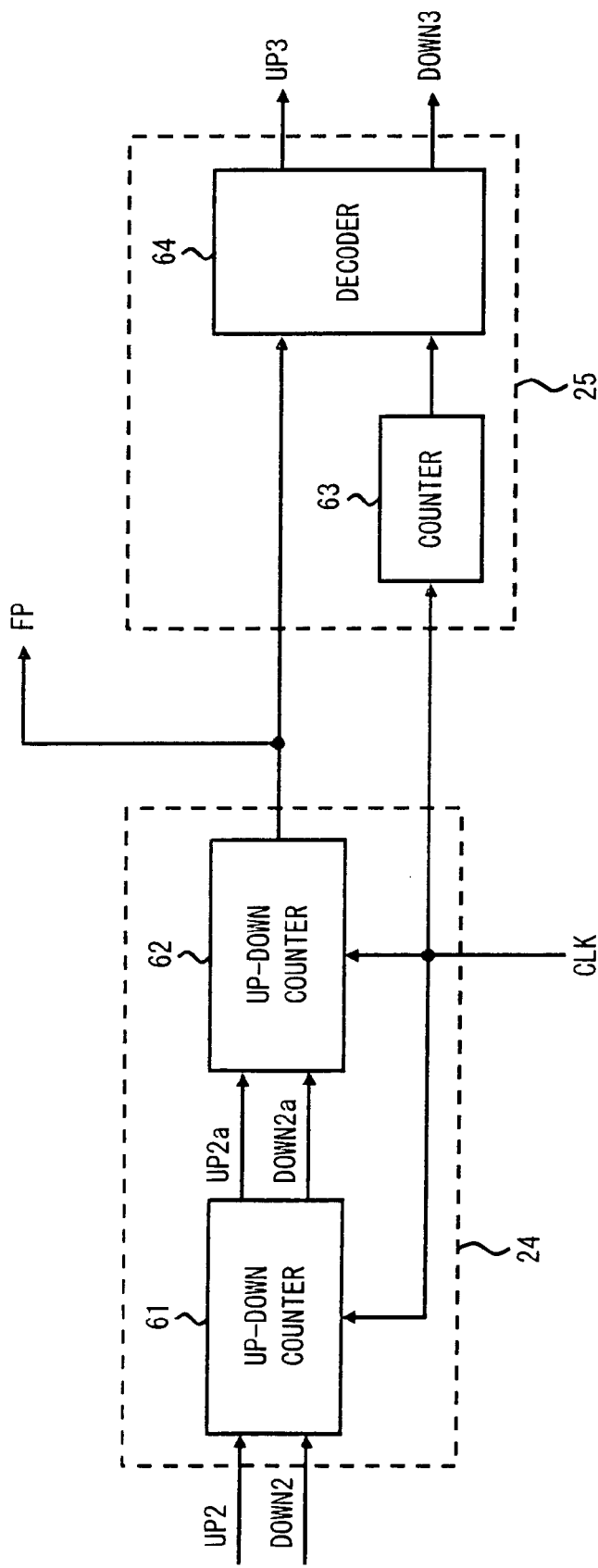
FIG. 4 is a block diagram of a second integrator and a pattern generator of a semiconductor device according to an embodiment.

FIG. 4 shows a detailed block diagram of the second integrator 23 and the pattern generator 24. Details of the second integrator 23 and the pattern generator 24 are explained hereinafter with reference to FIG. 4. As shown in FIG. 4, the second integrator 23 includes an up-down counter 61 and an up-down counter 62. Further, the pattern generator 24 includes a counter 63 and a decoder 64.

In the up-down counter 61, an upper-limit count value and a lower-limit count value are set. Further, when the up-signal UP2 is at a high level, the up-down counter 61 increases an integrated value according to the clock. On the other hand, when the down-signal DOWN2 is at a high level, the up-down counter 61 decreases the integrated value according to the clock. Then, when the integrated value reaches the upper-limit count value, the up-down counter 61 brings an up-signal UP2a to a high level, whereas when the integrated value reaches the lower-limit count value, the up-down counter 61 brings a down-signal DOWN2a to a high level.

When the up-down counter 62 has a count width of five bits, it outputs a value from −31 to +31 as a second count value. This second count value serves as a frequency difference signal FP. When the up-signal UP2a is at a high level, the up-down counter 62 increases the second count value according to the clock. On the other hand, when the down-signal DOWN2a is at a high level, the up-down counter 62 decreases the second count value according to the clock.

The counter 63 counts the clock. When the counter 63 has a count width of five bits, it outputs a value from 0 to 31 as a count value. Note that the counter 63 counts from 0 to 31 in a cyclic manner.

The decoder 64 determines the logical values of the up-signal UP3 and the down-signal DOWN3 based on the value indicated by the frequency difference signal FP and the count value output from the counter 63. It is indicated that the larger the number of times the state "up-signal UP2a=1" or "down-signal DOWN2a=1" is repeated in a row is, the larger the frequency difference between the input signal RD and the transmission clock CLK. The decoder 64 outputs "UP3=1" or "DOWN3=1" at a cycle that is in proportion to the frequency difference between the input signal RD and the transmission clock CLK based on the frequency difference signal FP and the count value of the counter 63. This process is carried out, for example, according to a truth table listing output values (UP3/DOWN3) corresponding to combinations of the count value of the counter 63 and the frequency difference signal FP.

The mixer 25 generates a phase selection signal based on the up-signal UP2 and the down-signal DOWN2, and the up-signal UP3 and the down-signal DOWN3. This phase selection signal is composed of an up-signal UP4 and a down-signal DOWN4. The phase interpolator 26 interpolates the phase of the transmission clock and thereby outputs a clock signal corresponding to the phase specified by the phase selection signal as a reception clock RCLK. Note that since the phase detector 21 uses two clock signals whose phases are different from each other by 180 degrees in this embodiment as the reception clock, the reception clock RCLK output by the phase interpolator 26 includes two signals. However, the number of the clock signals output as the reception clock RCLK and their phase differences can be changed according to the configuration of the phase detector 21.

Next, the frequency error adjuster 14 is explained hereinafter. As shown in FIG. 2, the frequency error adjuster 14 includes an adder 31, a delay circuit 32, and a multiplier 33. The adder 31 adds a value indicated by the output of the delay circuit 32 to a value indicated by the frequency difference signal FP, and outputs the resultant value. The delay circuit 32 holds the output signal of the adder 31, and outputs the held signal to the adder 31 after delaying the signal by one clock. The multiplier 33 multiplies the value indicated by the output signal of the adder 31 by a value indicated by an externally-supplied gain signal, and thereby adjusts the relation between the output signal of the adder 31 and the degree of the frequency correction to the transmission clock. The output signal of the multiplier 33 serves as a frequency adjustment signal Fadj. That is the frequency error adjuster 14 increases or decreases a value indicated by the frequency adjustment signal Fadj by integrating values indicated by the frequency difference signal FP from the time of the operation start.

The PLL circuit 12 includes a feedback circuit, and generates a transmission clock CLK by performing a frequency multiplication of the reference clock Fsrc by using the feedback circuit. Then, the PLL circuit 12 controls the frequency of the transmission clock CLK by adjusting the frequency-division ratio of a frequency divider provided within the feedback circuit according to the frequency adjustment signal Fadj.

Next, operations of the digital CDR 13, the frequency error adjuster 14, and the PLL circuit 12 shown in FIG. 2 are explained hereinafter. In the digital CDR 13, the phase detector 21 compares the phase of the input signal RD with that of the reception clock RCLK. The reception clock RCLK includes a plurality of clock signals, and one of the plurality of clock signals is used as a synchronization clock SCLK. Then, the phase detector 21 outputs an up-signal UP1 and a down-signal DOWN1 that indicates whether the synchronization clock SCLK is delayed from or is leading the input signal RD.

The up-signal UP1 and the down-signal DOWN1 are averaged by the first integrator 22. Then, the first integrator 22 outputs an up-signal UP2 and a down-signal DOWN2 based on the averaging process. The up-signal UP2 and the down-signal DOWN2 are input to the mixer 25. The mixer 25 controls an up-signal UP4 and a down-signal DOWN4 based on the up-signal UP2 and the down-signal DOWN2 and thereby corrects the phase of the reception clock RCLK. In this way, the digital CDR 13 performs phase control so that the phase of the reception clock RCLK gets closer to the phase of the input signal RD.

Further, when the frequency of the input signal RD is different from the frequency of the reception clock RCLK, i.e., when the frequency of the input signal RD is different from the frequency of the transmission clock CLK, the digital CDR 13 compensates for this frequency difference by using the frequency difference signal FP.

Firstly, when the frequency of the input signal RD is lower than that of the reception clock RCLK, the digital CDR 13 lowers the frequency of the reception clock RCLK by the clock selection method of the phase interpolator 26. Further, the frequency error adjuster 14 and the PLL circuit 12 lowers the frequency of the transmission clock CLK according to the frequency difference signal FP output by the digital CDR 13.

In this case, the phase detector 21 detects that the phase of the reception clock RCLK is leading the phase of the input signal RD and thereby brings the down-signal DOWN1 to a high level. Then, in response to the succession of the down-signal DOWN1, the first integrator 22 brings the down-signal DOWN2 to a high level. The phase interpolator 26 delays the phase of the reception clock RCLK based on this down-signal DOWN2. However, if the down-signal DOWN1 does not become a low level in spite of this phase control process, the period during which the down-signal DOWN2 is at a high level becomes longer even further. As a result, the value indicated by the frequency difference signal FP generated by the second integrator 23 decreases.

As the value indicated by the frequency difference signal FP becomes smaller, the pattern generator 24 increases the cycle at which the down-signal DOWN3 is brought to a high level. On the other hand, as the value indicated by the frequency difference signal FP becomes larger, the pattern generator 24 increases the cycle at which the up-signal UP3 is brought to a high level. That is, the longer the period during which the down-signal DOWN1 is at a high level becomes in the phase detector 21, the longer the period during which the down-signal DOWN3 output by the pattern generator 24 is at a high level becomes. Then, when both the down-signal DOWN2 and the down-signal DOWN3 become a high level, the mixer 25 brings the down-signal DOWN4 to a high level. As a result, the frequency of the reception clock RCLK output by the phase interpolator 26 is substantially lowered. Then, as the frequency of the reception clock RCLK gets closers to (or becomes equal to) the frequency of the input signal RD, the high-level periods of the up-signal UP1 and the down-signal DOWN1 output from the phase detector 21 become roughly equal to each other, thereby making the frequency of the reception clock RCLK stabilized.

Further, when the frequency difference signal FP becomes smaller, the value indicated by the frequency adjustment signal Fadj generated by the frequency error adjuster 14 also becomes smaller. As a result, the PLL circuit 12 lowers the frequency-division ratio of the frequency divider in the PLL circuit 12, thereby lowering the frequency of the transmission clock CLK. As the frequency of the transmission clock CLK is lowered, the frequency of the reception clock RCLK, which is generated from a signal obtained by performing interpolation on the transmission clock CLK, is also lowered.

On the other hand, when the frequency of the input signal RD is higher than that of the reception clock RCLK, the phase detector 21 detects that the phase of the reception clock RCLK is delayed from the phase of the input signal RD and thereby brings the up-signal UP1 to a high level. Then, in response to the succession of the up-signal UP1, the first integrator 22 brings the up-signal UP2 to a high level. The phase interpolator 26 advances the phase of the reception clock RCLK based on this up-signal UP2. However, if the up-signal UP1 does not become a low level in spite of this phase control process, the period during which the up-signal UP2 is at a high level becomes longer even further. As a result, the value indicated by the frequency difference signal FP generated by the second integrator 23 increases.

As the value of the frequency difference signal FP becomes larger, the pattern generator 24 extends the period during which the up-signal UP3 is at a high level. Then, when both the up-signal UP2 and the up-signal UP3 become a high level, the mixer 25 brings the up-signal UP4 to a high level. As a result, the frequency of the reception clock RCLK output by the phase interpolator 26 is substantially increased. Then, as the frequency of the reception clock RCLK gets closers to (or becomes equal to) the frequency of the input signal RD, the high-level periods of the up-signal UP1 and the down-signal DOWN1 output from the phase detector 21 become roughly equal to each other, thereby making the frequency of the reception clock RCLK stabilized.

Further, when the frequency difference signal FP becomes larger, the value indicated by the frequency adjustment signal Fadj generated by the frequency error adjuster 14 also becomes larger. As a result, the PLL circuit 12 increases the frequency-division ratio of the frequency divider in the PLL circuit 12, thereby increasing the frequency of the transmission clock CLK. As the frequency of the transmission clock CLK is increased, the frequency of the reception clock RCLK, which is generated from a signal obtained by performing interpolation on the transmission clock CLK, is also increased.

As explained above, in the semiconductor device 1, the reception clock RCLK is generated by performing phase interpolation on the transmission clock CLK in the digital CDR 13. Then, the digital CDR 13 generates a frequency difference signal FP, on which the frequency difference between the input signal RD and the transmission clock CLK is reflected, from the phase difference between the input signal RD and the reception clock RCLK. Therefore, the semiconductor device 1 can detect a frequency deviation earlier and thereby improve the frequency tracking ability of the transmission clock CLK.

Figure 7:
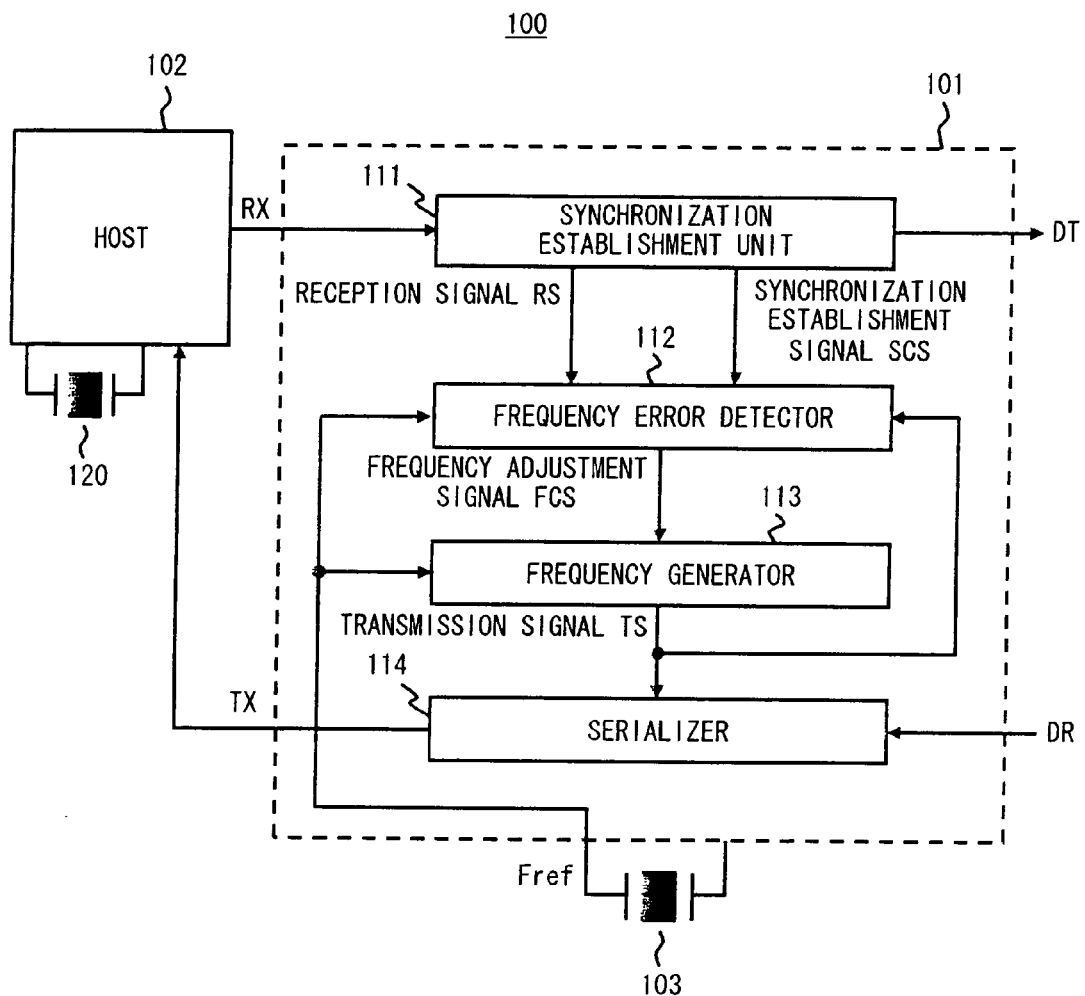
FIG. 7 is a block diagram of a communication system disclosed in Japanese Unexamined Patent Application Publication No. 2007-135189.

In the related-art example shown in FIG. 7, for example, it requires 3000 clock-cycles (2 nsec) to detect an error of 333 ppm in an input signal RD of 1.5 GHz. In contrast to this, in the semiconductor device 1, assuming that the phase interpolation number of the phase interpolator 26 is 64, an error of 333 ppm can be detected in 47 clock-cycles (one sixty-fourth of 3000 clock-cycles).

Further, in the semiconductor device 1 according to this embodiment of the present invention, the frequency difference signal FP generated by the digital CDR 13 is generated in the frequency loop that is originally provided for the frequency control of the reception clock RCLK performed by the digital CDR 13. That is, in the semiconductor device 1, there is no need to add any additional circuit to generate the frequency difference signal FP, and thereby minimizing the increase of the circuit area.

Further, in the semiconductor device 1 according to this embodiment, even if the reference clock Fsrc is generated by a resonation device having a low accuracy such as a ceramic resonator, it is possible to generate a highly-accurate transmission clock CLK from the reference clock Fsrc based on the input signal RD containing highly-accurate clock information.

Further, in the semiconductor device 1 according to this embodiment, the phase detector 21 is composed solely of a logic circuit(s). Further, the phase detector 21 detects the phase difference between the input signal RD and the reception clock RCLK through digital processing. Note that in clock-and-data recovery circuits having a phase interpolator, it is common to control the phase interpolator by using digital signals. Therefore, when the phase difference between the input signal RD and the reception clock RCLK is detected through analog processing, it may require to convert detected values into digital values (analog-digital conversion process). This analog-digital conversion process is usually unsuitable for high-speed processing. That is, in the detection method in which the phase difference is detected through analog processing, it is very difficult to control the frequency of the transmission clock CLK based on a high-frequency input signal RD. The serial data communication is getting faster and faster every year. Therefore, in such applications, it is very important to detect the phase difference and perform the feedback process of the detected phase difference at high speeds.

Second Embodiment

Figure 5:
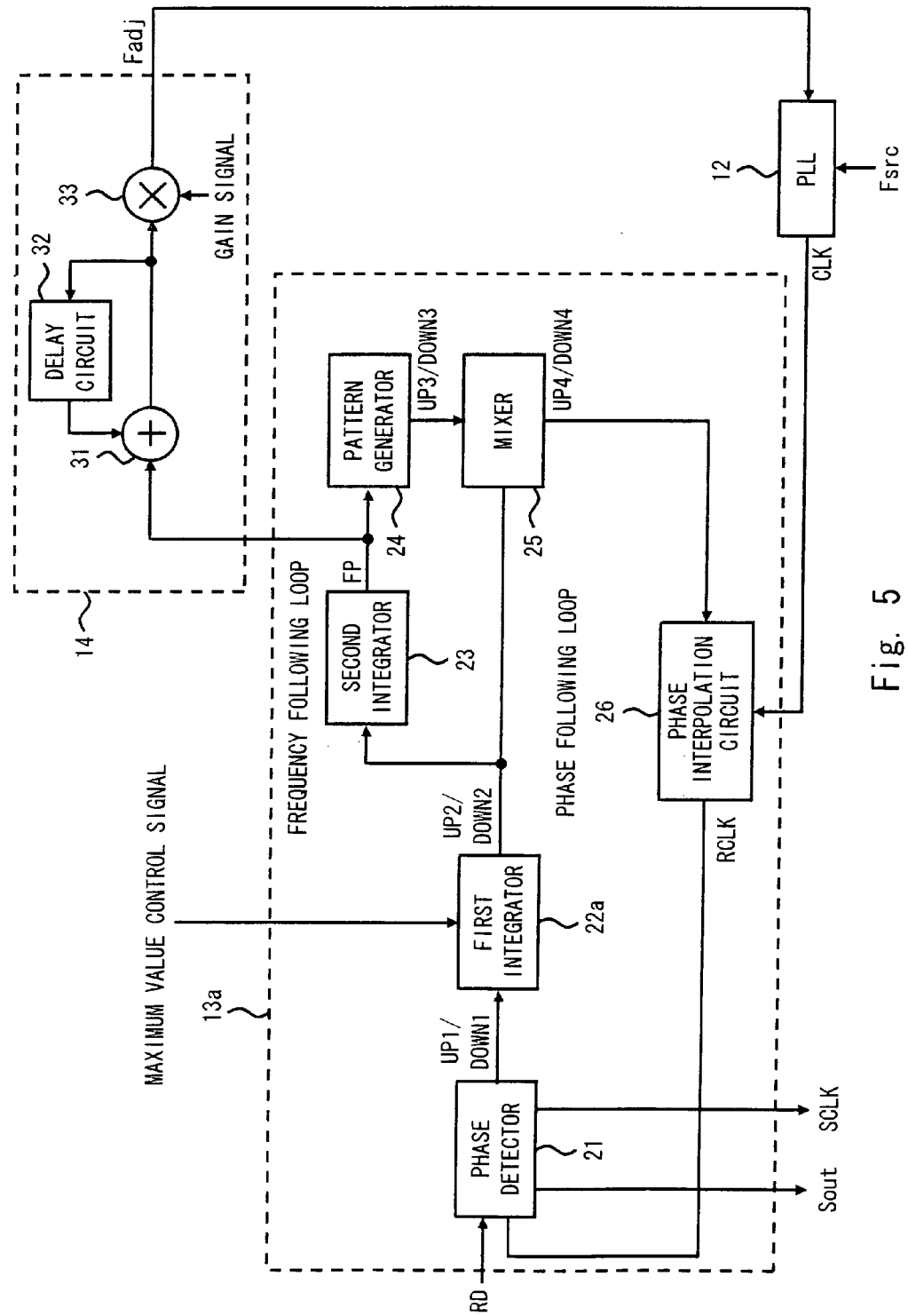
FIG. 5 is a block diagram of a digital CDR, a frequency error adjuster, and a clock generation circuit of a synchronization clock according to another embodiment.

As another embodiment, a modified example of the digital CDR 13 is explained. FIG. 5 shows a digital CDR 13a as a modified example of the digital CDR 13. FIG. 5 shows a block diagram corresponding to FIG. 2. As shown in FIG. 5, the digital CDR 13a includes a first integrator 22a in place of the first integrator 22. In the first integrator 22a, an upper-limit count value and a lower-limit count value are set according to a maximum value control signal. This maximum value control signal is supplied from other circuits (not shown).

The maximum value control signal is used to set the absolute values of the upper-limit count value and the lower-limit count value at smaller values at the start of the operation. Then, when the frequency of the transmission clock CLK is stabilized, the maximum value control signal is used to set the upper-limit count value and the lower-limit count value at such values that the reception signal RXin has an increased tolerance to jitter.

The digital CDR 13a controls the upper-limit count value and the lower-limit count value of the first integrator 22a by using the maximum value control signal so that the updating cycle of the frequency difference signal FP is increased at the start of the operation. That is, the frequency control of the transmission clock CLK, in which the frequency is controlled based on the frequency difference signal FP, is performed more quickly, thereby reducing the time necessary to make the frequency of the transmission clock CLK converge. Further, after the transmission clock CLK is stabilized, the upper-limit count value and the lower-limit count value are set at appropriate values so that the reception signal RXin has an improved tolerance to jitter.

Third Embodiment

Figure 6:
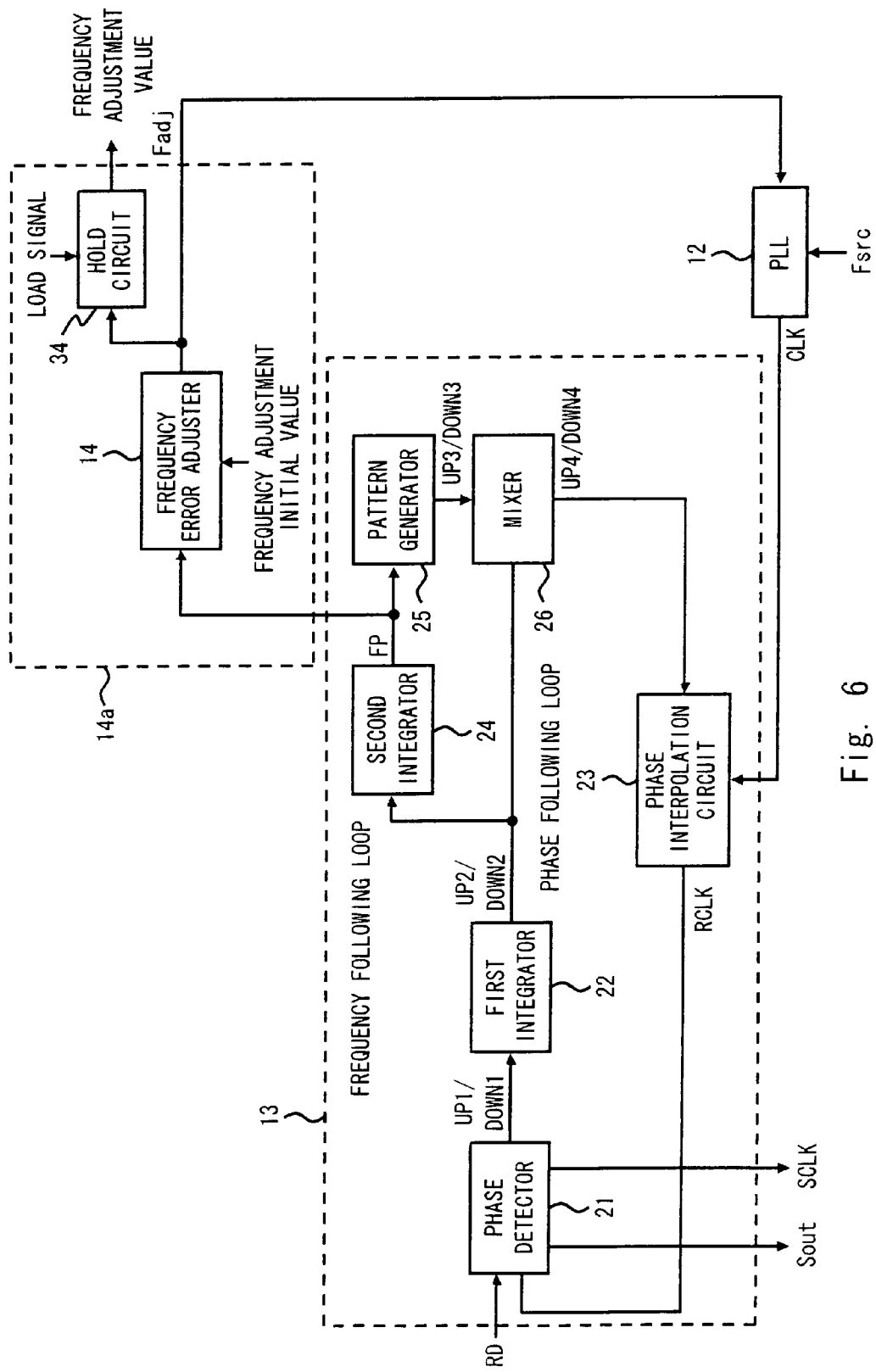
FIG. 6 is a block diagram of a digital CDR, a frequency error adjuster, and a clock generation circuit of a synchronization clock according to another embodiment.

As another embodiment, a modified example of the frequency error adjuster 14 is explained. FIG. 6 shows a frequency error adjuster 14a as a modified example of the frequency error adjuster 14. FIG. 6 shows a block diagram corresponding to FIG. 2. As shown in FIG. 6, the frequency error adjuster 14a includes a frequency error adjuster 14 and a hold circuit 34. That is, the frequency error adjuster 14a is obtained by adding a hold circuit 34 to the frequency error adjuster 14.

A load signal that becomes an enabled state when the frequency of the transmission clock CLK is stabilized is input to the hold circuit 34 from other circuits (not shown). The hold circuit 34 holds the value of the frequency adjustment signal Fadj at a time when the load signal becomes an enabled state as a frequency adjustment value. Then, upon the next start-up, the hold circuit 34 supplies the held frequency adjustment value to the delay circuit 32 of the frequency error adjuster 14 as a frequency adjustment initial value. In this way, the frequency error adjuster 14a can output an optimized frequency adjustment signal Fadj from the start of the operation, thereby reducing the time necessary for the convergence of the transmission clock CLK.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above. The first to third embodiments can be combined as desirable by one of ordinary skill in the art. Further, for example, the frequency difference signal FP may be a value indicating both the polarity value and the magnitude of a frequency difference, or may be a value indicating the polarity value alone. When the frequency difference signal FP indicates only the polarity value of a frequency difference, it is preferable to use an adder that increments (e.g., increases by one) or decrements (e.g., decreases by one) the value according to the polarity value as the adder 31 of the frequency error adjuster 14.

Furthermore, it is noted that, Applicant's intent is to encompass equivalents of all claim elements, even if amended later during prosecution.

What is claimed is:
1. A semiconductor device comprising:
a clock-and-data recovery circuit comprising:
a phase tracking loop that generates a phase difference signal indicating a phase-lead or a phase-delay between a reception clock generated from a transmission clock and an input signal and makes a phase of the reception clock track a phase of the input signal;
a frequency tracking loop that performs a control to make a frequency of the reception clock track a frequency of the input signal, the clock-and-data recovery circuit being configured to extract a data signal and a synchronization clock corresponding to the data signal from the input signal and to control a phase and a frequency of the reception clock;
a phase detector that detects a phase difference between the reception clock and the input signal and updates a polarity value indicated by the phase difference signal;
a first integrator that increases or decreases a first count value based on the phase difference signal, and when the first count value reaches a predetermined value, outputs a first up-signal and a first down-signal;
a second integrator that increases or decreases a second count value based on the first up-signal and the first down-signal and outputs the second count value as a frequency difference signal;
a pattern generator that generates a second up-signal and a second down-signal at a predetermined interval based on the frequency difference signal;
a mixer that generates a phase selection signal based on the first up-signal and the first down-signal, and the second up-signal and second down-signal; and
a phase interpolator that selects a phase by interpolating a phase of the transmission clock according to the phase selection signal and outputs a resultant clock as the synchronization clock;
a frequency error adjuster that increases or decreases a value indicated by a frequency adjustment signal according to the frequency difference signal generated based on the phase difference signal in the frequency tracking loop; and
an oscillator that increases or decreases a frequency of the transmission clock based on the value indicated by the frequency adjustment signal,
wherein the phase tracking loop comprises the phase detector, the first integrator, the mixer, and the phase interpolator, and
wherein the frequency tracking loop comprises the phase detector, the first integrator, the second integrator, the pattern generator, the mixer, and the phase interpolator.

2. The semiconductor device according to claim 1, wherein the phase difference signal indicates each of a phase-lead and a phase-delay by one bit.

3. The semiconductor device according to claim 1, wherein the first integrator is set with the predetermined value by an externally-supplied maximum value control signal, and the maximum value control signal is used to set the predetermined value at a smaller value before a frequency of the transmission clock satisfies a predetermined stability condition than a value after the stability condition is satisfied.

4. The semiconductor device according to claim 1, wherein the frequency error adjuster comprises:
an adder that adds a value indicated by the frequency difference signal to a value indicated by the frequency adjustment signal at a previous time and thereby generates the frequency adjustment signal at a present time; and
a delay circuit that delays the frequency adjustment signal output from the adder and supplies the delayed frequency adjustment signal to the adder.

5. The semiconductor device according to claim 4, wherein the frequency error adjuster further comprises a hold circuit that stores a value indicated by the frequency adjustment signal in a state where a frequency of the transmission clock is stabilized, and the delay circuit outputs the value stored in the hold circuit in an initial state.

6. The semiconductor device according to claim 1, further comprising a transmitter circuit that transmits transmission data based on the transmission clock.

7. The semiconductor device according to claim 1, wherein the oscillator comprises a feedback loop that generates the transmission clock based on a frequency of a reference clock and feeds back the transmission clock, and the feedback loop comprises a frequency divider to which the frequency adjustment signal is input.

8. The semiconductor device according to claim 7, wherein the reference clock is output from one of a ceramic resonator and a variable oscillator capable of controlling its oscillating frequency.

9. A semiconductor device comprising:
a clock-and-data recovery circuit comprising:
a phase tracking loop that generates a phase difference signal indicating a phase-lead or a phase-delay between a reception clock generated from a transmission clock and an input signal and makes a phase of the reception clock track a phase of the input signal;
a frequency tracking loop that performs a control to make a frequency of the reception clock track a frequency of the input signal, the clock-and-data recovery circuit being configured to extract a data signal and a synchronization clock corresponding to the data signal from the input signal and to control a phase and a frequency of the reception clock;
a first integrator that increases or decreases a first count value based on the phase difference signal, and when the first count value reaches a predetermined value, outputs a first up-signal and a first down-signal; and
a second integrator that increases or decreases a second count value based on the first up-signal and the first down-signal and outputs the second count value as a frequency difference signal;
a frequency error adjuster that increases or decreases a value indicated by a frequency adjustment signal according to the frequency difference signal generated based on the phase difference signal in the frequency tracking loop; and
an oscillator that increases or decreases a frequency of the transmission clock based on the value indicated by the frequency adjustment signal.

10. The semiconductor device according to claim 9, wherein the clock-and-data recovery circuit further comprises:
a pattern generator that generates one or more of a second up-signal and a second down-signal at a predetermined interval based on the frequency difference signal.

11. The semiconductor device according to claim 9, wherein the second integrator generates an intermediate frequency difference signal based on the first up-signal and the first down-signal.

12. The semiconductor device according to claim 9, wherein the second integrator comprises a plurality of up-down counters.

13. The semiconductor device according to claim 9, wherein the first integrator is set with the predetermined value by an externally-supplied maximum value control signal and the maximum value control signal is used to set the predetermined value.

14. The semiconductor device according to claim 13, wherein the predetermined value set at a time before a frequency of the transmission clock satisfies a predetermined stability condition comprises a value less than the predetermined value set at a time after the stability condition is satisfied.

* * * * *